United States Patent
Fuhrmann et al.

(10) Patent No.: US 11,245,012 B2
(45) Date of Patent: Feb. 8, 2022

(54) STACKED HIGH BARRIER III-V POWER SEMICONDUCTOR DIODE

(71) Applicant: AZUR SPACE Solar Power GmbH, Heilbronn (DE)

(72) Inventors: Daniel Fuhrmann, Heilbronn (DE); Gregor Keller, Heilbronn (DE); Clemens Waechter, Lauffen am Neckar (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 16/863,585

(22) Filed: Apr. 30, 2020

(65) Prior Publication Data
US 2020/0350408 A1    Nov. 5, 2020

(30) Foreign Application Priority Data
Apr. 30, 2019    (DE) .................. 10 2019 003 069.9

(51) Int. Cl.
*H01L 29/15* (2006.01)
*H01L 29/06* (2006.01)
(Continued)

(52) U.S. Cl.
CPC ........ *H01L 29/157* (2013.01); *H01L 29/0619* (2013.01); *H01L 29/205* (2013.01); *H01L 29/861* (2013.01)

(58) Field of Classification Search
CPC . H01L 29/157; H01L 29/0619; H01L 29/205; H01L 29/861; H01L 29/267;
(Continued)

(56) References Cited

U.S. PATENT DOCUMENTS

| | | |
|---|---|---|
| 3,995,303 A | 11/1976 | Nahory et al. |
| 9,305,772 B2 | 4/2016 | Hashimoto |

(Continued)

FOREIGN PATENT DOCUMENTS

| | | |
|---|---|---|
| CN | 100356507 C | 12/2007 |
| DE | 10 2016 013 540 A1 | 5/2018 |

(Continued)

OTHER PUBLICATIONS

Rybalchenko et al., "Metamorphic InGaAs photo-converters on GaAs substrates," J. of Physics Conf. Series, RYCPS 2015, vol. 690, pp. 1-5 (2016).

(Continued)

*Primary Examiner* — Shahed Ahmed
(74) *Attorney, Agent, or Firm* — Muncy, Geissler, Olds & Lowe, P.C.

(57) ABSTRACT

A stacked high barrier III-V power semiconductor diode having an at least regionally formed first metallic terminal contact layer and a heavily doped semiconductor contact region of a first conductivity type with a first lattice constant, a drift layer of a second conductivity type, a heavily doped metamorphic buffer layer sequence of the second conductivity type is formed. The metamorphic buffer layer sequence has an upper side with the first lattice constant and a lower side with a second lattice constant. The first lattice constant is greater than the second lattice constant. The upper side of the metamorphic buffer layer sequence is arranged in the direction of the drift layer. A second metallic terminal contact layer is arranged below the lower side of the metamorphic buffer layer sequence. The second metallic terminal contact layer is integrally bonded with a semiconductor contact layer.

18 Claims, 5 Drawing Sheets

(51) Int. Cl.
*H01L 29/205* (2006.01)
*H01L 29/861* (2006.01)

(58) Field of Classification Search
CPC ............... H01L 29/04; H01L 29/0684; H01L 29/872–8725; H01L 29/868; H01L 33/00–648; H01L 27/15–156; H01L 2933/00–0091
See application file for complete search history.

(56) References Cited

U.S. PATENT DOCUMENTS

| | | | |
|---|---|---|---|
| 10,074,540 B2 | 9/2018 | Dudek | |
| 10,192,745 B2 | 1/2019 | Dudek | |
| 10,263,124 B2 | 4/2019 | Dudek | |
| 10,312,381 B2 | 6/2019 | Dudek | |
| 10,340,394 B2 | 7/2019 | Dudek | |
| 10,734,532 B2 | 8/2020 | Dudek | |
| 2006/0017063 A1* | 1/2006 | Lester | H01L 21/02546 257/190 |
| 2009/0078310 A1* | 3/2009 | Stan | H01L 31/06875 136/255 |
| 2013/0082239 A1* | 4/2013 | Pan | H01L 33/0093 257/13 |
| 2015/0179863 A1* | 6/2015 | Huffaker | H01L 31/1844 257/186 |
| 2017/0222066 A1* | 8/2017 | Derkacs | H01L 31/1844 |
| 2019/0221676 A1* | 7/2019 | Dudek | H01L 29/20 |
| 2019/0326446 A1* | 10/2019 | Dudek | H01L 33/025 |

FOREIGN PATENT DOCUMENTS

| | | |
|---|---|---|
| DE | 10 2016 013 541 A1 | 5/2018 |
| DE | 10 2016 015 056 A1 | 6/2018 |
| DE | 10 2017 002 935 A1 | 9/2018 |
| DE | 10 2017 002 936 A1 | 9/2018 |
| JP | S 55-80375 A | 6/1980 |
| JP | 2001156301 A | 6/2001 |
| JP | 2018164083 A | 10/2018 |

OTHER PUBLICATIONS

Tanzid et al., "Analysis of electrical and optical characteristics of InGaSb PIN photodiodes," IET Optoelectron., vol. 6, No. 5, pp. 242-249 (2012).
German Ashkinazi, "GaAs Power Devices," pp. 8-9.

* cited by examiner

STACKED HIGH BARRIER III-V POWER SEMICONDUCTOR DIODE

This nonprovisional application claims priority under 35 U.S.C. § 119(a) to German Patent Application No. 10 2019 003 069.9, which was filed in Germany on Apr. 30, 2019, and which is herein incorporated by reference.

BACKGROUND OF THE INVENTION

Field of the Invention

The present invention relates to a stacked high barrier III-V power semiconductor diode.

Description of the Background Art

From "GaAs Power Devices" by German Ashkinazi, ISBN 965-7094-19-4, pp. 8 and 9, a high-voltage resistant P-I-N semiconductor diode made of GaAs is known.

Stacked high barrier III-V power semiconductor diodes and corresponding manufacturing methods are known from the publications DE 10 2016 013 540 A1 (which corresponds to U.S. Pat. No. 10,263,124), DE 10 2016 013 541 A1 (which corresponds to U.S. Pat. No. 10,074,540), DE 10 2016 015 056 A1 (which corresponds to U.S. Pat. No. 10,192,745), DE 10 2017 002 935 A1 (which corresponds to U.S. Pat. No. 10,312,381) and DE 10 2017 002 936 A1 (which corresponds to U.S. Pat. No. 10,340,394), which are all herein incorporated by reference.

From JP 555-80375A and U.S. Pat. No. 3,995,303 A, photo diodes with InGaAs layers are known. A method for bonding InP and GaAs is known from CN 100 356 507 C.

Generic diodes have breakdown voltages above 200V and should have low series resistance in addition to low forward voltage, in order to reduce power loss. The diodes should also have the lowest possible, reverse leakage current of under 1 microampere.

SUMMARY OF THE INVENTION

It is therefore an object of the present invention to provide a device which further develops the prior art.

According to an exemplary embodiment of the invention, a stacked high barrier III-V power semiconductor diode is provided, comprising an at least regionally formed first metallic terminal contact layer and a heavily doped semiconductor contact region of a first conductivity type with a dopant concentration greater than $1 \times 10^{18}$ $N/cm^3$ and a first lattice constant.

Further, a drift layer of a second conductivity type with the first lattice constant and a layer thickness greater than 10 microns is provided.

In addition, a heavily doped metamorphic buffer layer sequence of the second conductivity type with a layer thickness of more than 0.2 microns and less than 20 microns is formed.

The metamorphic buffer layer sequence has an upper side with the first lattice constant and a lower side with a second lattice constant, wherein the first lattice constant is greater than the second lattice constant.

The upper side of the metamorphic buffer layer sequence is arranged in the direction of the drift layer. The lower side in the direction of a second metallic terminal contact.

The second metallic terminal contact layer is arranged below the lower side of the metamorphic buffer layer sequence.

It should be noted that the above-mentioned regions and layers are arranged in the specified sequence.

The second metallic terminal contact layer is integrally bonded with a semiconductor contact layer.

The heavily doped semiconductor contact region and the drift layer and the metamorphic buffer layer sequence in each case comprise a III-V compound or consist of elements of a III-V compound.

Further, a stacked high barrier III-V power semiconductor diode is also provided, comprising a first metallic terminal contact layer formed at least in some regions and a heavily doped semiconductor contact region of a second conductivity type with a dopant concentration greater than $1 \times 10^{18}$ $N/cm^3$ and with a first lattice constant.

Further, a drift layer of the second conductivity type with the first lattice constant and with a layer thickness greater than 10 microns is provided.

In addition, a heavily doped metamorphic buffer layer sequence of the first conductivity type is formed with a layer thickness of more than 0.2 microns and less than 20 microns.

The metamorphic buffer layer sequence has an upper side with the first lattice constant and a lower side with a second lattice constant, wherein the first lattice constant is larger than the second lattice constant.

The upper side of the metamorphic buffer layer sequence is disposed in the direction of the drift layer; the lower side of the metamorphic buffer layer sequence is disposed in the direction of a second metallic terminal contact.

The second metallic terminal contact layer is arranged below the lower side of the metamorphic buffer layer sequence.

It should be noted that the above-mentioned regions and layers are arranged in the order mentioned.

The second metallic terminal contact layer is integrally bonded with a semiconductor contact layer.

The heavily doped semiconductor contact region and the drift layer and the metamorphic buffer layer sequence comprise a III-V compound or consist of elements of a III-V compound.

It should be noted that the term "consist of elements of a III-V compound" is understood to be a compound of the mentioned substances without further III-V elements. However, dopants such as zinc or silicon or tin or carbon are included. Consequently, for example, "consists of GaAs", means that only gallium and arsenic but not In or Al or P, etc. are included as III-V elements.

The term "comprising a compound" accordingly means, for example for GaAs, that aside from gallium and arsenic, further III-V elements such as phosphorus, aluminum, or indium may be present, in addition to any dopants.

The III-V semiconductor layers are preferably formed in each case at least partially mutually planar or partially mutually trough-shaped, the lateral configuration of the respective III-V semiconductor layers preferably being the same size for the planar arrangement.

It should also be noted that the term "semiconductor layer" is preferably used synonymously with the term "semiconductor region". However, the term "semiconductor region" is generally used for a trough-shaped configuration of the intermediate region and the term "semiconductor layer" generally designates a layer having at least a planar lower side and/or a planar upper side.

It should also be noted that the metallic terminal contact layers in each case have very good electric conductivity and comprise or preferably consist of one or more metallic layers, wherein said metallic layers preferably also include compounds such as, for example, Ge and/or Au and/or Pd.

The terminal contact layers establish an electrically low-ohmic contact to the immediately adjacent, heavily doped semiconductor contact layers. It is understood that the respective semiconductor contact layers are formed on an upper side or a lower side of the III-V power semiconductor diodes, directly adjacent to the metallic terminal contact layers.

Furthermore, the terminal contact layers can be connected by bonding wires with contact fingers, so-called pins, in that the power semiconductor diodes are arranged on a carrier, for example, in the form of a lead frame.

It should also be noted that the breakdown voltage of the high barrier III-V power semiconductor diodes is above 200 V. In particular, the breakdown voltage of the high barrier III-V power semiconductor diodes is in a range between 300V and 2000 V or in a range between 600 V and 1200 V or in a range between 1000 V and 1400 V or in a range between 1200 V and 2000 V.

An advantage of the different lattice constants is that above the metamorphic buffer, III-V compounds or III-V materials with a smaller bandgap can be used than the III-V layers or the III-V substrates or the group IV substrates below the metamorphic buffer layer sequence.

In other words, by means of the metamorphic buffer layer sequence, the active layers of the high barrier power diode lying above the metamorphic buffer layer sequence can be at least partially decoupled, with regard to the electrical properties, from the electrical properties of the layers lying underneath.

In particular, for the active layers, III-V compounds can be grown with a mobility above GaAs and with a lower forward voltage than GaAs. Preferably, an InGaAs compound with a lattice constant in the range of the InP lattice constant, or with a lattice constant equal to the InP lattice constant, can be used.

With lower forward voltage, losses can be greatly reduced by means of the III-V power semiconductor diode in the case of forward bias. With greater mobility, the transient electrical properties are improved, such as the switching frequency and the series resistance of the III-V power semiconductor diode. On the other hand, favorable III-V material such as GaAs or Ge can be used as growth substrate.

Another advantage is that in the case of III-V power semiconductor diodes, as compared to silicon or in part also SiC, in particular the electrons have a smaller effective mass or higher mobility.

Also, with the III-V power semiconductor diodes, as compared to Si, higher temperatures can be obtained at the PN junctions without the III-V semiconductor diodes being destroyed. This way, III-V semiconductor diodes can be used up to temperatures of 300° C., i.e., also in hot environments.

Another advantage as compared to SiC is that III-V semiconductor diodes can be manufactured at significantly lower costs than semiconductor structures made of SiC with comparable electrical properties.

In a further development, the heavily doped metamorphic buffer layer sequence is of the second conductivity type or of the first conductivity type and has a dopant concentration greater than $5 \times 10^{17}$ N/cm$^3$ or greater than $1 \times 10^{17}$ N/cm$^3$ or greater than $3 \times 10^{16}$ N/cm$^3$ or greater than $1 \times 10^{16}$ N/cm$^3$.

In an embodiment, the semiconductor contact region borders directly on the drift layer.

Alternatively, the heavily doped semiconductor contact region is spaced apart from the drift layer by a heavily doped intermediate layer of a first conductivity type with a dopant concentration of less than $5 \times 10^{15}$ N/cm$^3$ and with a first lattice constant and with a thickness between 1 micron and 30 microns.

In an embodiment, the metamorphic buffer layer sequence directly borders on the drift layer. Alternatively, the metamorphic buffer layer sequence is spaced from the drift layer by a doped intermediate layer of a first conductivity type with a dopant concentration of less than $5 \times 10^{15}$ N/cm$^3$ and with a first lattice constant and with a thickness between 1 microns and 30 microns.

The intermediate layer can comprise zinc and/or silicon and/or carbon as dopants. The dopant concentration of the intermediate layer is preferably less than the dopant concentration of the heavily doped semiconductor contact region immediately adjacent to the intermediate layer. In particular, the dopant concentration of the intermediate layer in one region is between a factor of 2 and a factor of four orders of magnitude smaller than the dopant concentration of the heavily doped semiconductor contact region immediately adjacent to the intermediate layer.

The dopant concentration of the intermediate layer can be greater than the dopant concentration of the drift layer. Most preferably, the dopant concentration of the intermediate layer is greater than the dopant concentration of the drift layer by at least a factor of 2 up to a factor of 100, or by at least a factor of 10 up to a factor of 50.

It is understood that in all embodiments, the intermediate layer is of a different conductivity type than the drift layer, so that the PN junction of the power semiconductor diode in each case is formed between the drift layer and the intermediate layer, provided an intermediate layer is formed.

The intermediate layer is preferably p-doped.

The first metallic terminal contact layer can be integrally bonded with the semiconductor contact region and the second metallic terminal contact layer is integrally bonded with the semiconductor contact layer.

In an embodiment, a substrate layer of the first conductivity type or the second conductivity type is provided below the metamorphic buffer layer sequence.

The substrate layer can have the second lattice constant and comprises Ge or GaAs or Si or InP. In another embodiment, the substrate layer consists of Ge or GaAs or Si or InP.

In a further development, a substrate layer of the first conductivity type or the second conductivity type is formed between the drift layer and the second metallic terminal layer, and the substrate layer comprises a layer sequence with InP and GaAs or consists of the sequence of layers InP and GaAs.

In a further development, the metamorphic buffer layer sequence is formed as a semiconductor contact layer. One advantage is that in this way, the stacked high barrier III-V power semiconductor diode is thinner than it would be with a substrate formed underneath the buffer layer sequence. It is understood that the series resistance of the stacked power semiconductor diode is reduced with decreasing thickness of the layer sequence.

Preferably, the total thickness of the buffer layer sequence is less than 30 microns or less than 20 microns or less than 5 microns, but greater than 0.2 microns. Hereby, the total thickness of the stack of the III-V power semiconductor diodes is in a range between 15 microns and 30 microns or in a range between 20 microns and 40 microns or is less than 60 microns or is less than 40 microns or is less than 120 microns or is less than 180 microns.

In an embodiment, the metamorphic buffer layer sequence consists of $In_xGa_{1-x}As$ with $0 \leq x \leq 1$, wherein x=0 or x<0.02 at a lower side and x on the upper side is greater than the value of x on the lower side. Preferably, the limit value is x<1, most preferably x<0.8 or x<0.6 or x<0.4.

In general, x increases between the individual layers of the buffer layer sequence, starting from the lower side up to the upper side of the buffer layer sequence, wherein in an alternative embodiment with a few layers directly in succession, the value of x decreases somewhat. Between the plurality of layers of the buffer layer sequence, the value of x increases between two immediately successive layers. Here, the x increase takes place in either a stepped or linear or other manner.

Because the value of x on the upper side of the metamorphic buffer layer sequence is always greater than the value of x on the lower side of the metamorphic buffer layer sequence, the lattice constant on the upper side is larger than the lattice constant on the lower side. Accordingly, the bandgap on the upper side is smaller than on the lower side of the metamorphic buffer layer sequence. This reduces the forward voltage of the power semiconductor diode.

In a further development, the value of x increases monotonically from the lower side to the upper side. In a further development, the value of x has a local maximum or a local minimum in the vicinity of the upper side of the buffer layer sequence and increases or decreases towards the upper side. Preferably, the value of x is constant within the respective layer of the buffer layer sequence.

In an embodiment, a first heavily doped semiconductor layer forming a semiconductor contact layer is disposed between the metamorphic buffer layer sequence and the second metallic terminal contact layer, wherein the first heavily doped semiconductor layer comprises the second lattice constant.

The first heavily doped semiconductor layer is of the second conductivity type or the first conductivity type. Preferably, the first heavily doped semiconductor layer has a dopant concentration greater than $1 \times 10^{18}$ N/cm$^3$ and a layer thickness of more than 0.1 microns.

Alternatively, the first heavily doped semiconductor layer has a dopant concentration between $5 \times 10^{18}$ N/cm$^3$ and $5 \times 10^{19}$ N/cm$^3$ and a layer thickness between 0.5 microns and 4 microns.

The first heavily doped semiconductor layer can be formed below the metamorphic buffer layer sequence as part of the substrate layer. In one embodiment, the substrate layer consists of GaAs or Ge, wherein the value x for an In$_x$Ga$_{1-x}$As metamorphic buffer on the lower side is zero for a GaAs substrate layer and the value of x for an In$_x$Ga$_{1-x}$As metamorphic buffer on the lower side is between 0 and 0.02 for a Ge substrate layer.

The substrate layer can be formed as a semiconductor contact layer of the second conductivity type or the first conductivity type. The thickness of the substrate layer is preferably between 10 microns and 250 microns. Alternatively, the thickness of the substrate layer is between 50 microns and 130 microns or between 150 microns and 650 microns.

In a further development, a second heavily doped semiconductor layer with the first lattice constant can be formed between the metamorphic buffer layer sequence and the drift layer. The second heavily doped semiconductor layer is of the second conductivity type or the first conductivity type and has a dopant concentration greater than $1 \times 10^{18}$ N/cm$^3$ and a layer thickness of more than 0.1 microns.

Alternatively, the second heavily doped semiconductor layer has a dopant concentration between $5 \times 10^{18}$ N/cm$^3$ and $5 \times 10^{19}$ N/cm$^3$ and a layer thickness between 0.5 microns and 4 microns or between 0.3 microns and 10 microns.

In an embodiment, the semiconductor contact region and the semiconductor layers arranged between the semiconductor contact region and the upper side of the metamorphic buffer layer sequence each include an InGaAs compound or consist of InGaAs.

The first conductivity is p-type and the second conductivity is n-type or the first conductivity is n-type and the second conductivity is p-type.

The semiconductor contact region can be formed as a planar layer or trough-shaped. In particular in an epitaxial formation, the heavily doped semiconductor contact region is formed as a planar layer, while in an implantation the heavily doped semiconductor contact region is preferably formed trough-shaped in that dopants are implanted into the region of the drift layer to form the heavily doped semiconductor contact region.

The first heavily doped semiconductor layer consists of GaAs or the first semiconductor layer comprises a GaAs compound. Preferably, the drift layer and the semiconductor contact region in each case comprise an InGaAs compound or respectively consist of InGaAs.

The second heavily doped semiconductor layer and the drift layer and the semiconductor contact region in each case include an InGaAs compound or the second semiconductor contact layer and the drift layer and the semiconductor contact region respectively consist of InGaAs, wherein preferably the drift layer consists of In$_x$Ga$_{1-x}$As with 0.1<x<0.6.

The semiconductor contact region and the semiconductor layers can be formed monolithically, that is, the layers of the power semiconductor diode are arranged stacked on one another without a semiconductor bond.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

In all figures, for reasons of clarity, in each case only a sectional view or a cross-sectional view of a III-V power semiconductor diode is shown.

It should be noted, however, that in a plan view, all of the III-V power semiconductor diodes depicted in the sectional view have either a square or a rectangular circumference, or a rectangular circumference with rounded edges or a circular circumference.

In other words, in the plan view, the III-V power semiconductor diode has the same layer sequences as in the respective cross-sectional view.

Also, the semiconductor contact regions and the semiconductor layers in each case comprise a III-V compound or consist of the elements of a III-V compound, wherein each semiconductor region and each semiconductor layer each have an upper side and a lower side.

In this case, the upper side points in the direction of the metallic contact or metallic terminal contact, which is arranged on the upper side of the layer stack, while the lower side in each case points in the direction of the metallic contact or metallic terminal contact, which is arranged on the lower side of the layer stack.

It should also be noted for all embodiments that the term "intermediate layer" is preferably used synonymously with the term "intermediate region".

However, the term "intermediate region" or the term "semiconductor contact region" generally designates a trough-shaped configuration, whereas the term "intermediate layer" or "semiconductor contact layer" generally denotes in each case a layer having at least a planar lower side and/or a planar upper side.

In particular, the depicted metamorphic buffers include a plurality of III-V semiconductor layers or consist of a plurality of III-V semiconductor layers, wherein the lattice constant generally changes from one III-V semiconductor layer to another.

In the present case, a plurality is understood to mean a number of at least three and a maximum of thirty, or a number of at least five and a maximum of ten semiconductor layers. Further, the metamorphic buffer is formed in each case with as low an impedance as possible, that is, heavily doped.

Furthermore, it is true for all the illustrated embodiments that the III-V power semiconductor diodes comprise an upper side and a lower side, wherein preferably by means of a metallic terminal contact layer formed on the lower side, the III-V power semiconductor diode is arranged as a so-called "die" on a metal frame or metal carrier also called a "lead frame".

A full-surface formation of the metallic terminal contact layer on the lower side, in particular as large as possible, improves the thermal coupling to the carrier.

Figure 1:
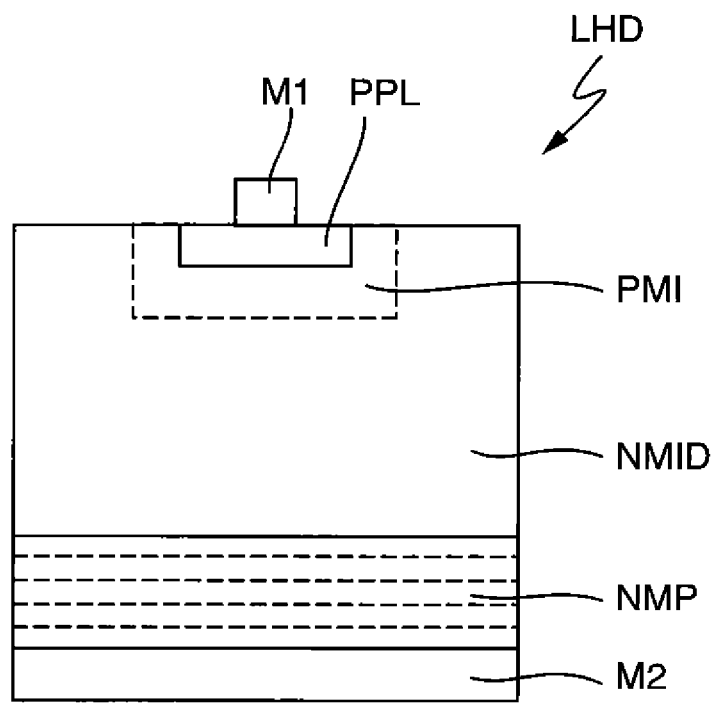
FIG. 1 is a cross-sectional view of an exemplary embodiment of a power semiconductor diode according to the invention.

The illustration in FIG. 1 shows a stacked high barrier III-V power semiconductor diode LHD in a PN structure.

The power semiconductor diode LHD comprises a regionally formed first metallic terminal contact layer M1 and a p+ heavily doped semiconductor contact region PPL with a dopant concentration greater than $1 \times 10^{18} \text{N/cm}^3$ and a first lattice constant.

The semiconductor contact region PPL is trough-shaped and is preferably prepared by means of a mask and implantation process. In this case, dopants are introduced into a region of the n–drift layer or the p– drift layer, wherein the dopants are preferably activated by a temperature process. The first metallic terminal contact layer and the p+ heavily doped semiconductor contact region PPL are integrally bonded to another.

Between the p+ heavily doped semiconductor contact region PPL and an n– drift layer NMID, a p– intermediate region PM is arranged in a trough-shaped form, so that the p+ heavily doped semiconductor contact region PPL is spaced apart on all sides from the n–drift layer NMID. The p– doped intermediate region is shown in dashed lines because the p– doped intermediate region is optional, i.e., in a non-illustrated embodiment, the p– intermediate region is not formed. It is understood that without the p– intermediate region PMI, the p+ heavily doped semiconductor contact region PPL is integrally bonded with the n–drift layer NMID.

The p– intermediate region PMI has a doping of less than the p+ heavily doped semiconductor contact region PPL and greater than the n– drift layer NMID and is integrally bonded with the p+ heavily doped semiconductor contact region PPL and the n– drift layer NMID. The p-intermediate region PMI has a dopant concentration of less than $5 \times 10^{15} \text{ N/cm}^3$ and the first lattice constant and a thickness between 1 micron and 30 microns.

In addition to the n– drift layer NMID with the first lattice constant and with a layer thickness LHD greater than 10 microns, the III-V power semiconductor diode also comprises an n+ heavily doped metamorphic buffer layer sequence NMP with a dopant concentration greater than $1 \times 10^{17} \text{ N/cm}^3$ and a layer thickness above 0.2 microns and smaller than 20 microns. The n–drift layer NMID and the n+ heavily doped metamorphic buffer layer sequence NMP are integrally bonded with one another.

The metamorphic buffer layer sequence NMP has an upper side with the first lattice constant and a lower side with a second lattice constant, wherein the first lattice constant is greater than the second lattice constant. The upper side of the metamorphic buffer layer sequence NMP is arranged in the direction of the drift layer NM ID.

On the lower side of the metamorphic buffer layer sequence NMP, a second metallic terminal contact layer M2 is formed, so that the second metallic terminal contact layer M2 is integrally bonded with the metamorphic buffer layer sequence NMP.

The aforementioned regions and layers are arranged in the order mentioned.

In an alternative embodiment, not shown, the high barrier III-V power semiconductor diode comprises more III-V semiconductor layers, in particular at the PN junction and/or between a very heavily doped semiconductor layer or semiconductor region, with a dopant concentration above $1 \times 10^{17} \text{ N/cm}^3$ and a low doped semiconductor layer or semiconductor region with a dopant concentration below $5 \times 10^{17} \text{ N/cm}^3$.

Figure 2:
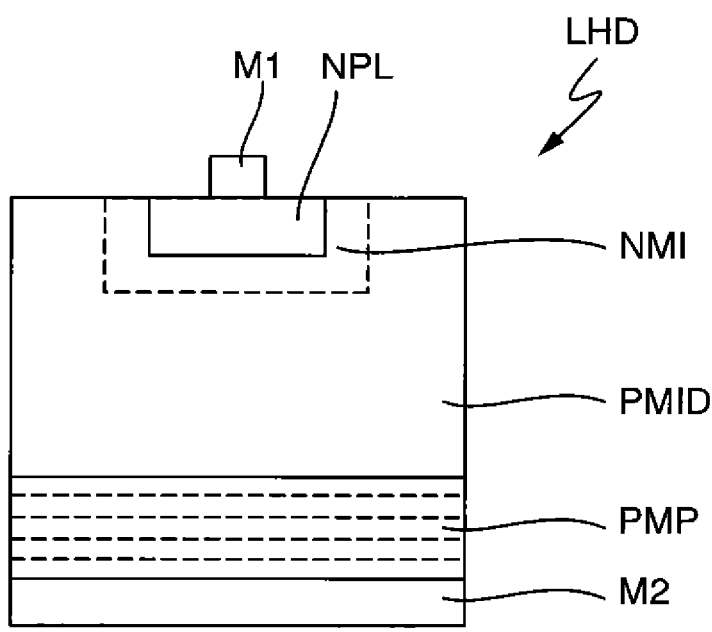
FIG. 2 is a cross-sectional view of an exemplary embodiment of a power semiconductor diode according to the invention.

The illustration in FIG. 2 shows a stacked high barrier III-V power semiconductor diode LHD in an n over p structure. The power semiconductor diode LHD has a regionally formed first metallic terminal contact layer M1 and an n+ heavily doped semiconductor contact region NPL with a dopant concentration greater than $1 \times 10^{18}$ N/cm$^3$ and with a first lattice constant.

The semiconductor contact region NPL is formed to be trough-shaped and is preferably made by means of a mask and implantation process. The first metallic terminal contact layer M1 and the n+ heavily doped semiconductor contact region NPL are integrally bonded with one another.

Between the n+ heavily doped semiconductor contact region NPL and a p− drift layer PMID, an n− intermediate region or n− intermediate layer NMI is arranged in a trough-shaped formation, so that the n+ heavily doped semiconductor contact region NPL is spaced apart on all sides from the p− drift layer PMID. The n− doped intermediate region is illustrated as an optional semiconductor layer with dashed lines, i.e., in a non-illustrated embodiment, the n intermediate region is not formed.

It is understood that without the n− intermediate region NMI, the n+ heavily doped semiconductor contact region NPL is integrally bonded with the p− drift layer PMID.

The n− intermediate region NMI has a doping less than the n+ heavily doped semiconductor contact region NPL and greater than the p− drift layer PMID and is integrally bonded with the n+ heavily doped semiconductor contact region NPL and the p− drift layer PMID. The n− intermediate region NMI has a dopant concentration of less than $5 \times 10^{15}$ N/cm$^3$ and the first lattice constant and a thickness between 1 micron and 30 microns.

In addition to the p− drift layer PMID with the first lattice constant and with a layer thickness greater than 10 microns, the III-V power semiconductor diode LHD also has a p+ heavily doped metamorphic buffer layer sequence PMP with a dopant concentration greater than $1 \times 10^{17}$ N/cm$^3$ and a layer thickness above 0.2 microns and less than 20 microns. The p− drift layer PMID and the p+ heavily doped metamorphic buffer layer sequence PMP are integrally bonded with one another.

On the upper side, the p+ metamorphic buffer layer sequence PMP has a first lattice constant, and a second lattice constant on the lower side, wherein the first lattice constant is greater than the second lattice constant. The upper side of the metamorphic buffer layer sequence PMP is arranged in the direction of the drift layer PMID.

On the lower side of the metamorphic buffer layer sequence PMP, a second metallic terminal contact layer M2 is formed, so that the second metallic terminal contact layer M2 is integrally bonded with the metamorphic buffer layer sequence PMP.

The aforementioned regions and layers are arranged in the order mentioned. In an alternative embodiment, not shown, the high barrier III-V power semiconductor diode comprises further III-V semiconductor layers particularly at the PN junction and/or between a very heavily doped semiconductor layer or semiconductor region with a dopant concentration more than $1 \times 10^{17}$ N/cm$^3$ and a very low doped semiconductor layer or semiconductor region with a dopant concentration below $5 \times 10^{17}$ N/cm$^3$.

Figure 3:
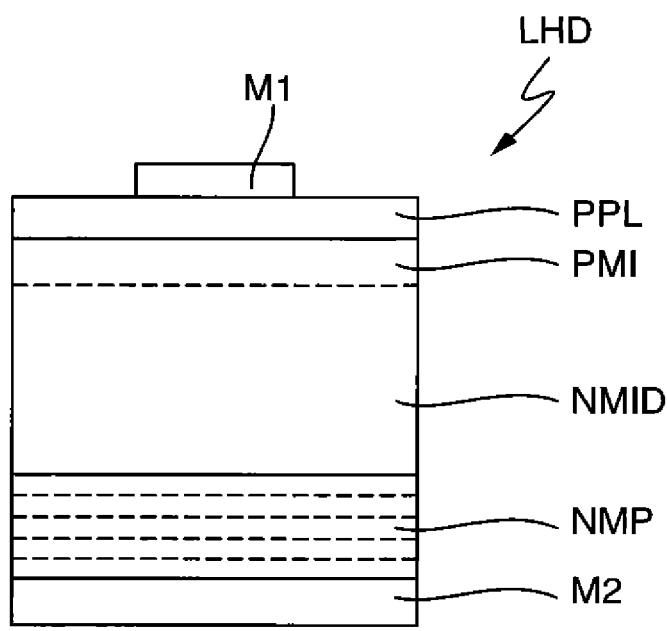
FIG. 3 is a cross-sectional view of an exemplary embodiment of a power semiconductor diode according to the invention.

A third embodiment is shown in FIG. 3. In the following, only the differences from the embodiment shown in connection with FIG. 1 will be explained.

The intermediate layer PMI and the heavily doped semiconductor contact layer PPL p+ are each formed in a planar manner. Such layer arrangements are produced by means of epitaxial processes, in particular by means of an MOVPE system. The p-type doped intermediate layer is shown in dashed lines, since the p-type doped intermediate layer is optional, i.e., in a non-illustrated embodiment, the p-type intermediate layer is not formed.

Figure 4:
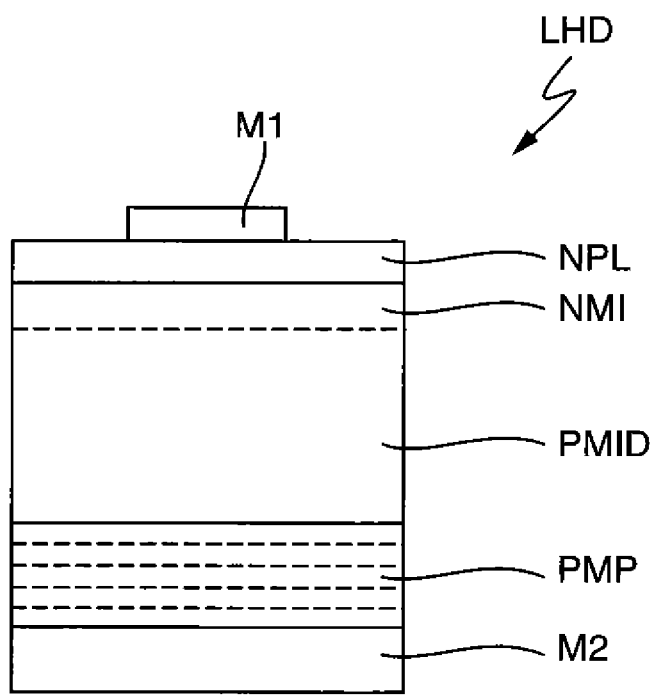
FIG. 4 is a cross-sectional view of an exemplary embodiment of a power semiconductor diode according to the invention.

A fourth embodiment is shown in FIG. 4. In the following, only the differences from the embodiment shown in connection with FIG. 2 will be explained.

The intermediate layer NMI and the heavily doped semiconductor contact layer NPL n+ are each formed in a planar manner. Such layer arrangements are produced by means of epitaxial processes, in particular by means of an MOVPE system. The n-type doped intermediate layer is shown in dashed lines, since the n-type doped intermediate layer is optional, i.e., in a non-illustrated embodiment, the n-type intermediate layer is not formed.

Figure 5:
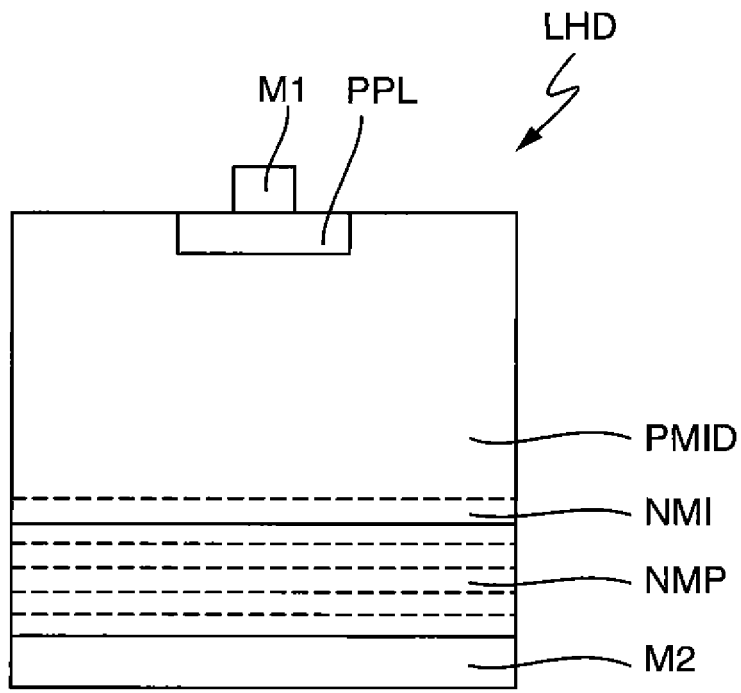
FIG. 5 is a cross-sectional view of an exemplary embodiment of a power semiconductor diode according to the invention.

A fifth embodiment is shown in FIG. 5. In the following, only the differences from the embodiment shown in connection with FIG. 1 will be explained.

The p− drift layer PMID is integrally bonded with the trough-shaped heavily doped p+ semiconductor contact region PPL, wherein the p+ semiconductor contact region PPL is produced by means of an implantation into the p− drift layer PMID. As a result, the p− drift layer is no longer planar on the upper side.

The p− drift layer PMID is integrally bonded with the n+ doped intermediate layer NMI and the heavily doped buffer layer NMP, wherein the p− drift layer PMID is planar on the lower side and the n− doped intermediate layer NMI is planar on the upper side and on the lower side, and the heavily doped buffer layer NMP is planar on the upper side and on the lower side.

The n− doped intermediate layer NMI is shown in dashed lines since the n− doped intermediate layer NMI is optional, that is, in a non-illustrated embodiment, the n− intermediate layer NMI is not formed. It is understood that without the n− intermediate layer NMI, the lower side of the p− drift layer PMID is integrally bonded with the upper side of the n+ metamorphic buffer layer sequence NMP.

Figure 6:
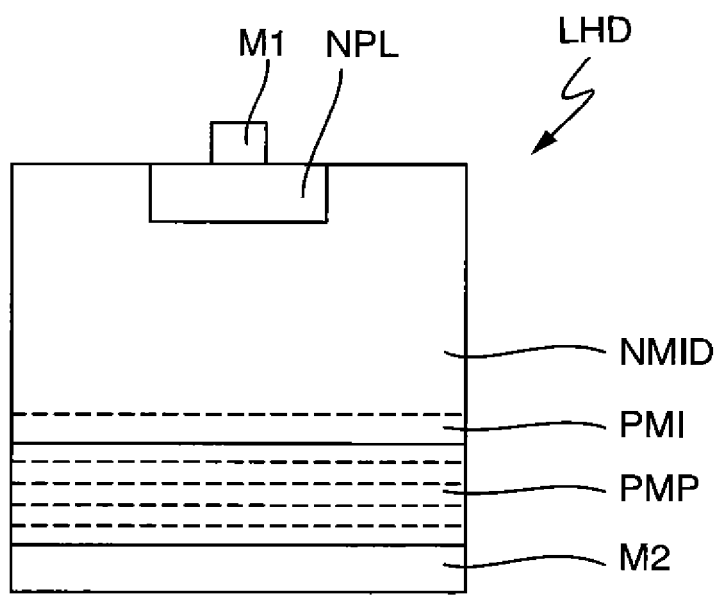
FIG. 6 is a cross-sectional view of an exemplary embodiment of a power semiconductor diode according to the invention.

A sixth embodiment is shown in FIG. 6. In the following, only the differences from the embodiment shown in connection with FIG. 2 will be explained.

An n− drift layer NMID is integrally bonded with the trough-shaped heavily doped n+ semiconductor contact region NPL, wherein the n+ semiconductor contact region NPL is produced by means of implantation into the n− drift layer NMID. Thereby, the n− drift layer NMID is no longer formed to be planar on the upper side.

A p− doped intermediate layer PMI and the heavily doped buffer layer are integrally bonded with the n− drift layer NMID, wherein the n− drift layer NMID is planar on the lower side and the p− doped intermediate layer PMI is planar on the upper side and on the lower side and the heavily doped buffer layer PMP is planar on the upper side and on the lower side.

The p-type doped intermediate layer PMI is shown in dashed lines because the p− doped intermediate layer PMI is optional, that is, in a non-illustrated embodiment, the p− intermediate layer PMI is not formed. It is understood that without the p− intermediate layer PMI, the lower side of the n− drift layer NMID is integrally bonded with the upper side of the p+ metamorphic buffer layer sequence PMP.

Figure 7:
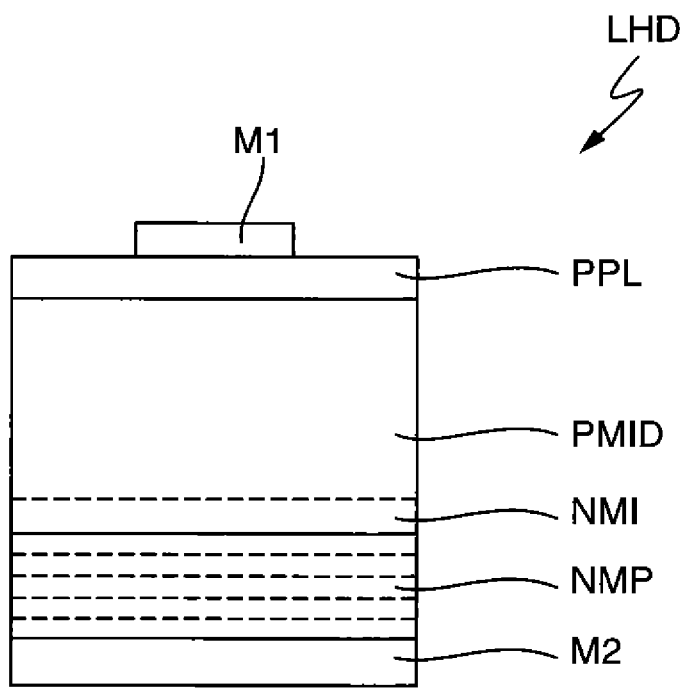
FIG. 7 is a cross-sectional view of an exemplary embodiment of a power semiconductor diode according to the invention.

FIG. 7 shows a seventh embodiment. In the following, only the differences from the embodiment shown in connection with FIG. 5 will be explained.

The p− drift layer PMID is integrally bonded with the stacked heavily doped p+ semiconductor contact region PPL, wherein the p+ semiconductor contact region PPL is produced by an epitaxial process step. As a result, the p+ semiconductor contact region PPL and the p− drift layer PMID are each formed to be planar.

Figure 8:
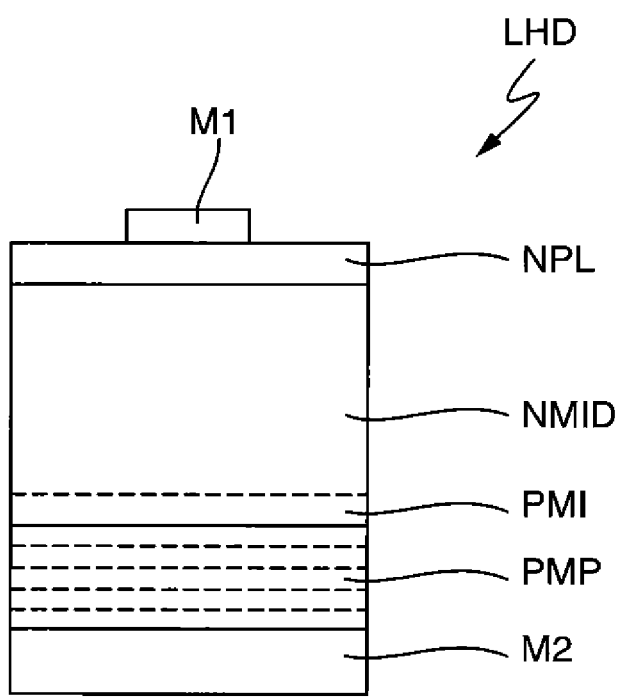
FIG. 8 is a cross-sectional view of an exemplary embodiment of a power semiconductor diode according to the invention.

An eighth embodiment is shown in FIG. 8. In the following, only the differences from the embodiment shown in connection with FIG. 6 will be explained.

The n− drift layer NMID is integrally bonded with the layered heavily doped n+ semiconductor contact region NPL, wherein the n+ semiconductor contact region NPL is produced by an epitaxial process step. As a result, the n+ semiconductor contact region NPL and the n− drift layer NMID are each formed to be planar.

Figure 9:
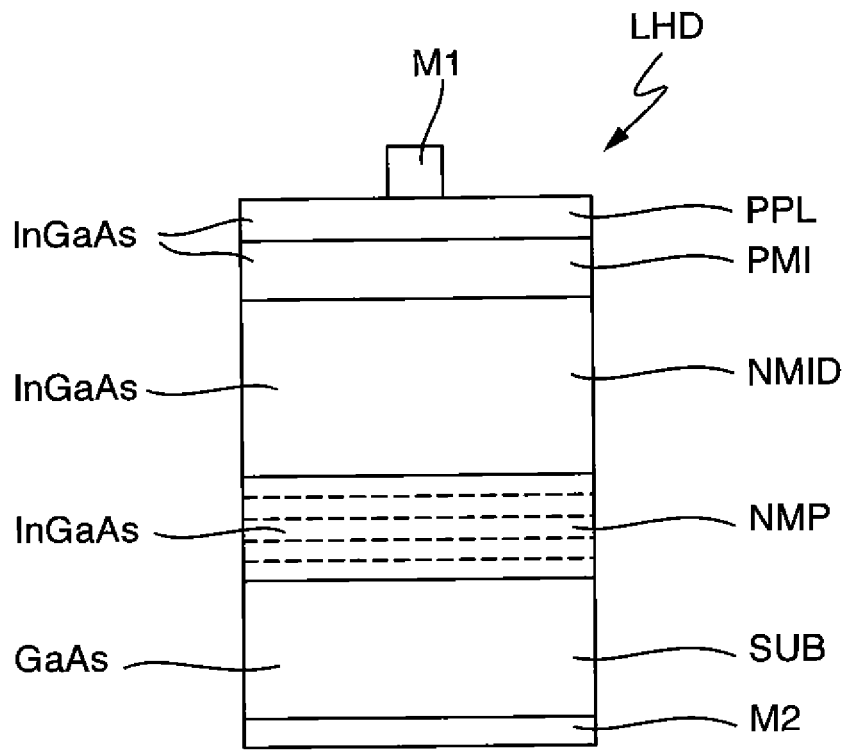
FIG. 9 is a cross-sectional view of an exemplary embodiment of a power semiconductor diode according to the invention.

FIG. 9 shows a ninth embodiment of a p over n structure. In the following, only the differences from the embodiment shown in connection with FIGS. 1 and 3 are explained.

The first metallic terminal contact layer M1 regionally formed on the upper side of the stacked power semiconductor diode LHD is integrally bonded with the upper side of a p+ heavily doped semiconductor contact layer PPL consisting of an InGaAs compound. The lower side of the p+ heavily doped semiconductor contact layer PPL is integrally bonded with the upper side of the p− intermediate layer PMI consisting of an InGaAs compound. The p− intermediate layer PMI and the heavily doped semiconductor contact layer p+ are each formed to be planar, wherein the two layer arrangements are preferably produced by means of an epitaxial process, in particular by means of an MOVPE system.

The lower side of the p− intermediate layer PMI is integrally bonded with the upper side of a planar n− drift layer NMID consisting of an InGaAs compound.

The lower side of the n− drift layer NMID is integrally bonded with the upper side of the planar n+ heavily doped metamorphic buffer layer sequence NMP consisting of an InGaAs compound.

It is understood that the upper side of the n+ heavily doped metamorphic buffer layer sequence NMP has the same lattice constant as the InGaAs semiconductor layers resting on the upper side of the n+ heavily doped metamorphic buffer layer sequence NMP. In other words, the resting InGaAs semiconductor layers are lattice matched to one another. Preferably, the InGaAs layers comprise the InP lattice constant.

The lower side of the n+ heavily doped metamorphic buffer layer sequence NMP is integrally bonded with the upper side of an n+ doped GaAs substrate SUB. The n+ doped GaAs substrate is preferably undiluted. For example, a 4″ GaAs wafer has a thickness of approximately 450 microns and a 6″ GaAs wafer has a thickness of about 650 microns.

The lower side of the n+ doped GaAs substrate SUB is integrally bonded with the full-surface second metallic terminal layer M2. The second metallic terminal layer M2 preferably consists of an alloy made from Au and/or Pd and/or Ge.

In a non-illustrated embodiment, the individual semiconductor layers consisting at least partly of an InGaAs compound are not integrally bonded with each other, as further layers consisting of an InGaAs compound are formed therebetween. For example, an additional n-type doped intermediate layer can be arranged between the n− drift layer NMID and the n+ heavily doped metamorphic buffer layer sequence NMP, wherein said additional n-type doped intermediate layer has a thickness between 1 micron and 15 microns. Furthermore, the doping of the additional intermediate layer is greater than the doping of the n− drift layer NMID but less than the doping of the n+ heavily doped metamorphic buffer layer sequence NMP.

It should also be noted that instead of the p over n structure, an n over p structure corresponding to the embodiments illustrated in connection with the illustrations of FIG. 4 or 6 or 8 can also be formed.

Figure 10:
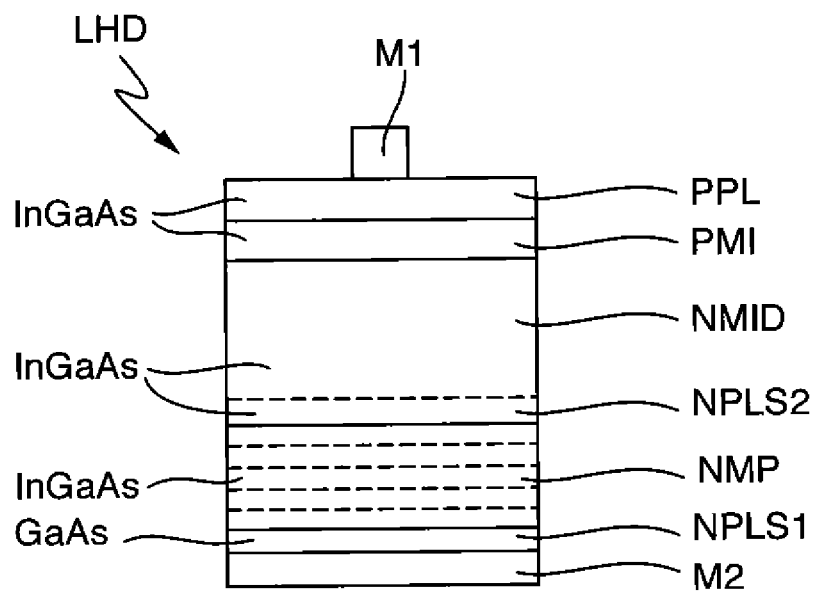
FIG. 10 is a cross-sectional view of an exemplary embodiment of a power semiconductor diode according to the invention.

A tenth embodiment is shown in FIG. 10. In the following, only the differences from the embodiment shown in connection with FIG. 9 will be explained.

An n+ first heavily doped semiconductor layer NPLS1 of GaAs formed as a semiconductor contact layer is disposed between the n+ heavily doped metamorphic buffer layer sequence NMP and the second metallic terminal contact layer M2. The first heavily doped semiconductor layer NPLS1 has a dopant concentration greater than $1 \times 10^{18}$ N/cm$^3$ and a layer thickness of more than 0.1 microns and of less than 10 microns or less than 5 microns.

An n+ second heavily doped semiconductor layer NPLS2 of an InGaAs compound is arranged between the n− drift layer NMID and the n+ heavily doped metamorphic buffer layer sequence NMP. It is understood that the lattice constant of the n+ second heavily doped semiconductor layer NPLS2 of the lattice constant corresponds to the overlying n− drift layer NMID, that is, the n+ second heavily doped semiconductor layer NPLS2 and the n− drift layer NMID are lattice matched to each other.

The n+ second heavily doped semiconductor layer NPLS2 has a dopant concentration greater than $1 \times 10^{18}$ N/cm$^3$ and a layer thickness of more than 0.1 microns.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A stacked high barrier III-V power semiconductor diode comprising:
   an at least regionally formed first metallic terminal contact layer;
   a first heavily doped semiconductor contact region of a first conductivity type with a dopant concentration greater than $1 \times 10^{18}$ N/cm$^3$ and with a first lattice constant;
   a doped intermediate layer of a first conductivity type with a dopant concentration of less than $5 \times 10^{15}$ N/cm$^3$, with the first lattice constant and with a thickness between 1 micron and 30 microns;
   a drift layer of a second conductivity type with the first lattice constant and with a layer thickness greater than 10 microns;
   a heavily doped metamorphic buffer layer sequence of the second conductivity type with a layer thickness of more than 0.2 microns and less than 20 microns, wherein the metamorphic buffer layer sequence has an upper side with the first lattice constant and a lower side with a second lattice constant, the upper side being arranged in a direction of the drift layer; and
   a second metallic terminal contact layer formed below the lower side of the metamorphic buffer layer sequence,
   wherein the first lattice constant is greater than the second lattice constant,
   wherein the first metallic terminal contact layer, the first heavily doped semiconductor contact region, the intermediate layer, the drift layer, the metamorphic buffer layer sequence, and the second metallic terminal contact layer are ordered in the order mentioned, wherein the second metallic terminal contact layer is integrally bonded with a semiconductor contact layer, and wherein at least the first heavily doped semiconductor contact region and the drift layer and the metamorphic buffer layer sequence comprise a III-V compound or consist of a III-V compound.

2. The stacked high barrier III-V power semiconductor diode according to claim 1, wherein the first heavily doped metamorphic buffer layer sequence is of the second conductivity type or the first conductivity type and has a dopant concentration greater than $5 \times 10^{17}$ N/cm$^3$ or greater than $1 \times 10^{17}$ N/cm$^3$ or greater than $3 \times 10^{16}$ N/cm$^3$ or greater than $1 \times 10^{16}$ N/cm$^3$.

3. The stacked high barrier III-V power semiconductor diode according to claim 1, wherein the first metallic terminal contact layer is integrally bonded with the semiconductor contact region and the second metallic terminal contact layer is integrally bonded with the semiconductor contact layer.

4. The stacked high barrier III-V power semiconductor diode according to claim 1, wherein a substrate layer of the first conductivity type or the second conductivity type is provided below the metamorphic buffer layer sequence and the substrate layer comprises the second lattice constant and Ge or GaAs or InP or consists of Ge or GaAs or InP.

5. The stacked high barrier III-V power semiconductor diode according to claim 1, wherein a substrate layer of the first conductivity type or the second conductivity type is provided below the metamorphic buffer layer sequence and the substrate layer comprises the second lattice constant and a layer sequence made of InP and GaAs or consists of the layer sequence made of InP and GaAs.

6. The stacked high barrier III-V power semiconductor diode according to claim 1, wherein a second heavily doped semiconductor layer is the semiconductor contact layer with the second lattice constant is arranged between the metamorphic buffer layer sequence and the second metallic terminal contact layer, and the second heavily doped semiconductor layer is of the second conductivity type or the first conductivity type and has a dopant concentration greater than $1 \times 10^{18}$ N/cm$^3$ and a layer thickness above 0.1 microns.

7. The stacked high barrier III-V power semiconductor diode according to claim 1, wherein a substrate layer of the first conductivity type or the second conductivity type is provided below the metamorphic buffer layer sequence, wherein a second heavily doped semiconductor layer formed below the metamorphic buffer layer sequence is part of the substrate layer, and wherein the substrate layer is formed as the semiconductor contact layer of the second conductivity type or the first conductivity type and has a thickness between 10 microns and 450 microns or between 350 microns and 1000 microns.

8. The stacked high barrier III-V power semiconductor diode according to claim 1, wherein a second heavily doped semiconductor layer with the first lattice constant is formed and the second heavily doped semiconductor layer is of the second conductivity type or the first conductivity type and has a dopant concentration greater than $1 \times 10^{18}$ N/cm$^3$ and a layer thickness of more than 0.1 microns.

9. The stacked high barrier III-V power semiconductor diode according to claim 1, wherein the semiconductor contact region and the semiconductor layers arranged between the semiconductor contact region and the upper side of the metamorphic buffer layer sequence each comprise an InGaAs compound or consist of InGaAs.

10. The stacked high barrier III-V power semiconductor diode according to claim 1, wherein the first conductivity type is p and the second conductivity type is n or the first conductivity type is n and the second conductivity type is p.

11. The stacked high barrier III-V power semiconductor diode according to claim 1, wherein the semiconductor contact region is formed as a planar layer or is trough-shaped.

12. The stacked high barrier III-V power semiconductor diode according to claim 6, wherein the another doped semiconductor layer consists of GaAs or comprises a GaAs compound and the drift layer and the semiconductor contact region each comprise an InGaAs compound or consist of InGaAs.

13. The stacked high barrier III-V power semiconductor diode according to claim 6, wherein the second heavily doped semiconductor layer and the drift layer and the semiconductor contact region each comprise an InGaAs compound or consist of InGaAs.

14. The stacked high barrier III-V power semiconductor diode according to claim 1, wherein the semiconductor contact region and the semiconductor layers are formed monolithically.

15. The stacked high barrier III-V power semiconductor diode according to claim 1, wherein the drift layer consists of $In_xGa_{1-x}As$ with $0.1<x<0.6$.

16. The stacked high barrier III-V power semiconductor diode according to claim 1, wherein the metamorphic buffer layer sequence consists of $In_xGa_{1-x}As$ with wherein on a lower side adjacent to the substrate layer, $x=0$ or $x$ is between 0 and 0.02, x increases from the lower side to the upper side up to a limit value of $x=0.6$ or $x=0.4$ and wherein the increase of x between the individual layers of the buffer layer sequence from the lower side to the upper side of the buffer layer sequence is formed to be stepwise or linear or otherwise increasing.

17. The stacked high barrier III-V power semiconductor diode according to claim 1, wherein the drift layer is directly adjacent to the first heavily doped semiconductor contact region.

18. The stacked high barrier III-V power semiconductor diode according to claim 1, wherein the heavily doped metamorphic buffer layer sequence has dopant concentration greater than $5 \times 10^{17}$ N/cm$^3$.

* * * * *